United States Patent
Shirai et al.

Patent Number: 6,137,687
Date of Patent: Oct. 24, 2000

[54] PRINTED CIRCUIT BOARD, IC CARD, AND MANUFACTURING METHOD THEREOF

[75] Inventors: Mitsugu Shirai; Shinichi Kazui; Hideaki Sasaki; Keiji Fujikawa; Makoto Matsuoka, all of Hadano, Japan

[73] Assignee: Hitachi, Ltd., Tokyo, Japan

[21] Appl. No.: 09/487,171

[22] Filed: Jan. 19, 2000

Related U.S. Application Data

[62] Division of application No. 08/906,247, Aug. 4, 1997.

[30] Foreign Application Priority Data

Aug. 9, 1996 [JP] Japan ................................ 8-211399

[51] Int. Cl.[7] .............................. H05K 1/18; H05K 3/46
[52] U.S. Cl. ..................... 361/749; 361/783; 174/254; 174/255; 174/260; 257/679; 235/492; 29/830; 29/832
[58] Field of Search .................... 361/748–751, 361/792, 795, 783; 174/254–258, 260, 261; 428/209, 210, 901; 257/679; 235/492; 427/96; 29/830–832, 839, 840, 854

[56] References Cited

U.S. PATENT DOCUMENTS

| | | | |
|---|---|---|---|
| 4,045,636 | 8/1977 | Yoder et al. | 438/901 |
| 4,258,096 | 3/1981 | LaMarche | 428/209 |
| 4,285,780 | 8/1981 | Schachter | 205/120 |
| 4,694,572 | 9/1987 | Leber et al. | 29/840 |
| 4,774,634 | 9/1988 | Tate et al. | 361/760 |
| 4,915,983 | 4/1990 | Lake et al. | 427/98 |
| 4,963,697 | 10/1990 | Peterson et al. | 174/252 |
| 5,352,926 | 10/1994 | Andrews | 257/717 |
| 5,405,809 | 4/1995 | Nakamura et al. | 438/64 |
| 5,451,721 | 9/1995 | Tsukada et al. | 361/792 |
| 5,564,617 | 10/1996 | Degani et al. | 228/6.2 |
| 5,569,886 | 10/1996 | Tanabe et al. | 174/260 |
| 5,739,476 | 4/1998 | Namgung | 174/255 |
| 5,837,992 | 11/1998 | Onozawa | 235/492 |
| 5,874,780 | 2/1999 | Murakami | 174/260 |
| 6,049,461 | 4/2000 | Haghiri-Tehrani et al. | 257/679 |
| 6,058,021 | 5/2000 | Yamamoto | 361/783 |

FOREIGN PATENT DOCUMENTS

| | | |
|---|---|---|
| 0720123 | 7/1996 | European Pat. Off. . |
| 2156525 | 5/1973 | Germany . |
| 2078448 | 1/1982 | United Kingdom . |

*Primary Examiner*—Jeffrey Gaffin
*Assistant Examiner*—John B. Vigushin
*Attorney, Agent, or Firm*—Mattingly, Stanger & Malur, P.C.

[57] ABSTRACT

In a method for manufacturing a printed circuit board, this printed circuit board can be manufactured by executing a simple manufacturing step within a short time period at in low cost without requiring a complex manufacturing process. A conductive material is pattern-printed on a base board and the printed conductive material is hardened to form a first conductor layer. Subsequently, an insulating material is pattern-printed on the first conductor layer, and the printed insulating material is hardened to thereby form a first insulating layer. A manufacturing step similar to the above-described step is repeatedly performed to thereby form a second conductor layer, a second insulating layer, and a third conductor layer. Furthermore, a manufacturing step similar to the above-explained step is repeatedly performed, so that a printed circuit board having a multi-conductor layer can be manufactured.

7 Claims, 11 Drawing Sheets

FIG. 11
39 STEPS IN TOTAL

FIG. 13A PRIOR ART

EXPOSE

FIG. 13B PRIOR ART

DEVELOP

FIG. 13C PRIOR ART

ETCHING

FIG. 13D PRIOR ART

CONDUCTOR PATTERN

PRINTED CIRCUIT BOARD, IC CARD, AND MANUFACTURING METHOD THEREOF

This is a divisional application of U.S. Ser. No. 08/906,247, filed Aug. 4, 1997.

BACKGROUND OF THE INVENTION

The present invention relates to a printed circuit board used in electronic appliances and a method for manufacturing the printed circuit board.

To achieve low cost, compactness, and high performance in current electronic appliances, large numbers of circuit boards are used. In general, so-called "printed circuit boards" and also "ceramic circuit boards" are popularized as this circuit board. That is, in a printed circuit board, epoxy resin and the like containing glass fiber are used as a base material, and a conductive material is formed on this base material. In a ceramic circuit board, a ceramics material such as alumina is used as a base material, and a conductive material is formed on this base material.

In FIG. 13A to FIG. 13D, there is shown a general-purpose method for manufacturing a printed board. A photosensitive resist 132 is coated on an epoxy board 134 on which copper is plated on a surface thereof. This epoxy board 134 with the copper plating 133 is exposed via a photomask 131 (see FIG. 13A), and then is developed, so that a predetermined pattern is formed on the resist film (see FIG. 13B). Thereafter, a copper pattern portion which is not covered by the resist is etched away (see FIG. 13C) to remove the resist film, so that a conductor pattern is formed (see FIG. 13D).

Furthermore, when a multi-layer is formed, a plurality of boards on which the conductor patterns have been formed by the above-described method are overlapped with each other while sandwiching adhesive agents (so-called "prepreg") between them. The overlapped boards are pressured under a high temperature environment so as to be adhered to each other, resulting in a formation of a stacked layer. Thereafter, through holes are formed at preselected positions by using a drill. Next, electrical conductivities are established in the through hole portions by way of the chemical plating process, or the electrical plating process. Then, an outermost layer is formed by way of the photolithography stage and the etching stage.

On the other hand, as a method for manufacturing a ceramics board, ceramic powder is first mixed with an organic binder to manufacture a sheet called a "green sheet". A through hole is made in this green sheet by using a punching tool. After conductive paste is filled into this through hole, a pattern is printed on the green sheet by the conductive paste in a similar manner. Furthermore, a plurality of such sheets are overlapped with each other, and the overlapped sheets are sintered at a high temperature of more than 1,000° C. by using a furnace to thereby manufacture this ceramic board.

SUMMARY OF THE INVENTION

As previously described, in accordance with the conventional manufacturing method, since a very large number of manufacturing steps such as the resist coating, exposing, developing, and etching steps are carried out so as to manufacture the circuit board, many production facilities such as the etching apparatus and the pressure-applying/adhering apparatus are required. Also, since complex steps such as the through hole forming step and the plating step for the inside of the through hole are needed, there are problems that high level manufacturing techniques are required and the higher manufacturing cost is needed.

An object of the present invention is to provide such a method for manufacturing a circuit board at low cost without executing the above-explained complex steps, while the total number of steps required to manufacture the circuit board is considerably reduced.

In accordance with the present invention, a printed circuit board is manufactured by a first step for pattern-printing a conductive material on a desirable portion on a base board made of epoxy resin, a ceramic material, or a plastic material and for hardening the printed conductive material to form a first conductor layer; a second step for pattern-printing an insulating material on a desirable portion on the first conductor layer and for hardening the printed insulating material to form a first insulating layer; and a third step for pattern-printing the conductive material on desirable portions on the first conductor layer and the first insulating layer and for hardening the printed conductive material to form a second conductor layer. As a consequence, the printed circuit board can be manufactured by way of a simple step and a simple facility without using the forming step of the through hole into the insulating layer and the step for plating the through hole, and without employing a large number of production facilities such as the pressure-applying/adhering facility. Thus, this printed circuit board can be manufactured at low cost and within a short time period.

Also, both a step for pattern-printing an insulating material on a desirable portion and for hardening the printed insulating material to thereby form an insulating layer, and a step for pattern-printing a conductive material on a desirable portion on this insulating layer and for hardening the printed conductive material to thereby form a conductor layer, are repeatedly performed. Then, the insulating layers are interposed among the conductor layers so as to form a multi-layer of conductor layers. As a result, there is no need to employ the pressure-applying/adhering step for overlapping the board on which the conductive materials are printed with the insulating board, and for applying the pressure to the overlapped board in high temperatures, so that shrinkage of the board can be suppressed.

After the insulating material is pattern-printed on a desirable portion of the board in which the conductor layer has been formed on the uppermost layer and the printed insulating material is hardened to thereby the insulating layer, the printing operations of the conductor layer and the insulating layer are repeatedly performed on this insulating layer so as to form a wiring pattern. As a result, the wiring layer can be further formed on the commercially available wiring board, so that high density packaging can be achieved.

Since an ultraviolet ray hardening type resin is employed as the insulating material, this insulating material can be hardened by merely irradiating ultraviolet rays having wavelengths suitable for this material, so that the insulating layer can be formed within a short time.

Furthermore, since the base board is processed by such an annealing process that this base board is heated at a temperature higher than the highest temperature applied to all of the manufacturing steps, the shrinkage rate of the base board can be considerably lowered, and also the positioning precision of the mask during the pattern printing operation can be improved.

In accordance with a packaging method of the present invention, an electronic component is mounted on a desirable portion on this conductor layer before the conductor layer is dried and hardened; and the conductor layer is hardened under such a condition that an electrode of the electronic component is made in contact with the conductor layer, whereby a conductor layer is formed, and the conductor layer is connected with the electronic component by way of the fixing force of the conductive paste. As a consequence, the electronic component can be packaged without executing the solder supplying step and the reflow step, the total number of manufacturing steps can be reduced, and the manufacturing cost can be reduced.

Also, a conductive material is pattern-printed on an opening portion on a conductor layer formed by pattern-printing the insulating material; an amount of the conductive material smaller than such an amount of the conductive material capable of completely filling the opening portion is filled into the opening portion; an electrode of an electronic component is inserted into the opening portion before the conductive material is hardened; and the conductive material is hardened under such a condition that the electrode of the electronic component is made in contact with the conductive material within the opening portion, whereby a conductor layer is formed and this conductor layer is connected to the electrode of the electronic component. Accordingly, the electronic component can be packaged under a thinner state, and even when a multi-layer board is manufactured, the overall thickness can be reduced. Then, it is possible to form such a circuit board capable of mounting electronic components in higher density than that of the conventional circuit board.

Also, the manufacturing method of the present invention may be applied to a thin card functioning as a printed circuit board. In this case, since the conductor forming step and the IC chip connecting step are simultaneously carried out in the packaging method, it is possible to manufacture a thinner card with higher packaging density. Also, when a transparent PET (polyethylene terephtalate) is employed as the base board, an inner surface of the transparent PET sheet is previously printed. As a result, a transparent luster of the PET sheet remains, and neither a concavity or convexity appears, which are produced when the surface of this PET card is printed out, and the printed pictorial design is not faded.

BRIEF DESCRIPTION OF THE DRAWINGS

For a better understanding of the present invention, reference may be made to the accompanying drawings, in which.

DESCRIPTION OF THE PREFERRED EMBODIMENTS

Referring now to the accompanying drawings, an embodiment of the present invention will be described in detail.

Figure 1:
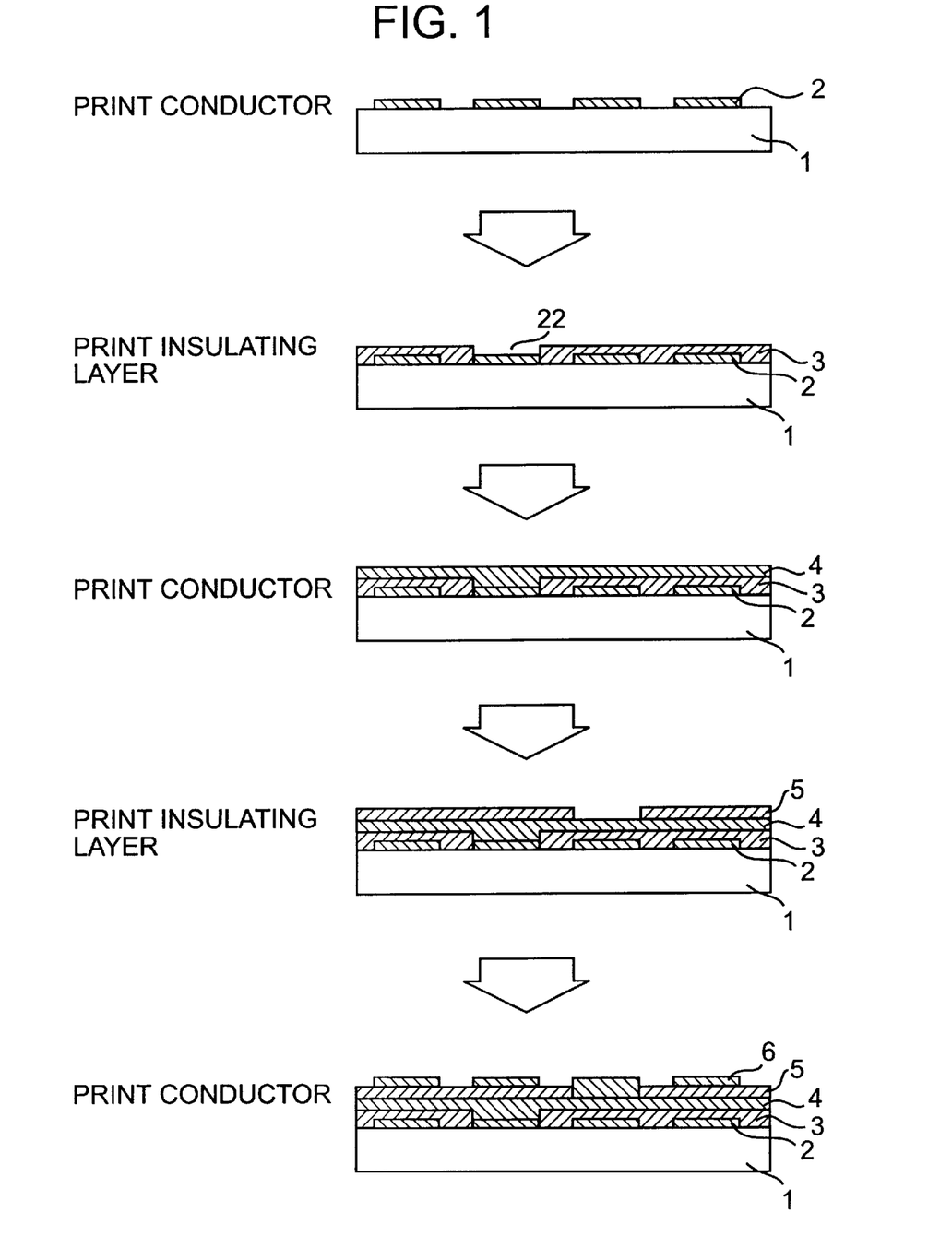
FIG. 1 illustrates a manufacturing step of a printed circuit board manufactured according to an embodiment of the present invention.

FIG. 1 illustratively shows a step for manufacturing a printed circuit board with three conductor layers according to an embodiment of the present invention.

The printed circuit board shown in FIG. 1 is constituted by a board 1, having, for instance, a plastic plate as a base material, a first conductor layer 2, a first insulating layer 3, a second conductor layer 4, a second insulating layer 5, and also a third conductor layer 6.

A method for manufacturing this printed circuit board will now be explained as follows:

First, a conductive material under paste condition is printed in a pattern form on the board 1 constituting the base by using, for instance, the screen printing method, so that the first conductor layer 2 is formed. In the screen printing method, a desired pattern shape is covered with a mask having an opening portion, the conductive paste is supplied thereto, and then the conductive paste is extended by using a squeegee.

Thereafter, the board 1 is transported to a furnace in which the board is heated and dried by using infrared rays, or into a furnace in which the board is dried by using hot air. Then, the first conductor layer 2 is dried/hardened in this sort of furnace.

Next, the board on which the first conductor layer 2 has been formed is covered with a mask having a desirable patterned opening portion, to which an insulating material in a paste form is supplied. Then, this insulating paste is extended by using a squeegee, and a pattern is printed on the first conductor layer 2 and the board 1 to thereby form the first insulating layer 3. At this time, an area 22 must be formed in a desirable portion of the first insulating layer 3 in such a manner that the first conductor layer is electrically connected to the second conductor layer. This area 22 will constitute an opening portion. Thereafter, the first insulating layer 3 is dried so as to be hardened.

Furthermore, in accordance with a method similar to the above-described method for forming the first conductor layer 2, the second conductor layer 4 is printed out in a pattern form to be hardened. At this time, although the first conductor layer 2 is electrically insulated from the second conductor layer 4 by way of the first insulating layer 3, the conductor material under paste condition flows into the area 22 on which the insulating material on the first conductor layer 2 is not coated when the pattern of the second conductor layer 4 is printed, so that a path portion is formed to thereby electrically connect the first conductor layer 2 with the second conductor layer 4.

Moreover, manufacturing steps similar to the above-described steps are repeated so as to form the second insulating film 5 on the second conductor layer 4, and the third conductor layer 6 is formed thereon. As a consequence, the printed circuit board having the three conductor layers can be manufactured.

As the conductor material under paste condition, usually, the following materials may be used, i.e., epoxy resin, thermosetting resin such an melamine resin and acrylic resin, and thermoplastic resin are mixed with metal fine powder such as copper and silver.

As the insulating material, the following materials may be used, i.e., epoxy resin, a ceramic material such as alumina powder mixed with these organic materials, or ultraviolet hardening resin.

The pattern forming by the conductor paste and the insulating material paste is carried out via the mask in accordance with the conventional manner. As the printing mask, the following various mask printing methods may be employed, i.e., the pattern is formed on a polyester mesh by emulsion in printing of the conductor layers and the insulating layers, or a metal mask may be used.

Generally speaking, the printed conductor materials and the printed insulating materials are normally hardened. It should be understood that if the above-described ultraviolet hardening type resin (resist) is selected as the paste, then these materials can be hardened within a short time by irradiating ultraviolet rays having wavelengths suitable to the materials.

Figure 11:
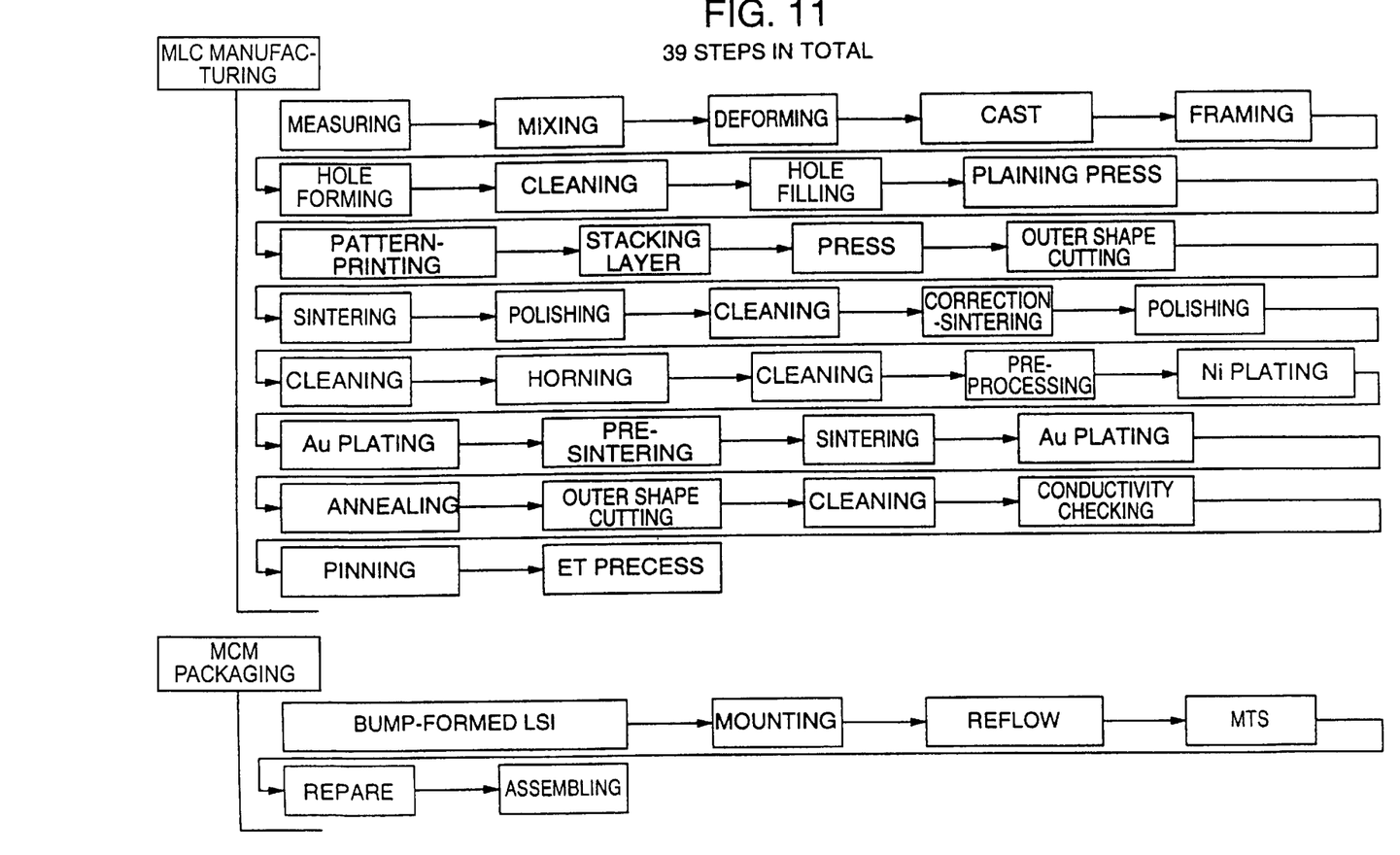
FIG. 11 illustratively shows one example of the conventional board manufacturing method.
Figure 12:
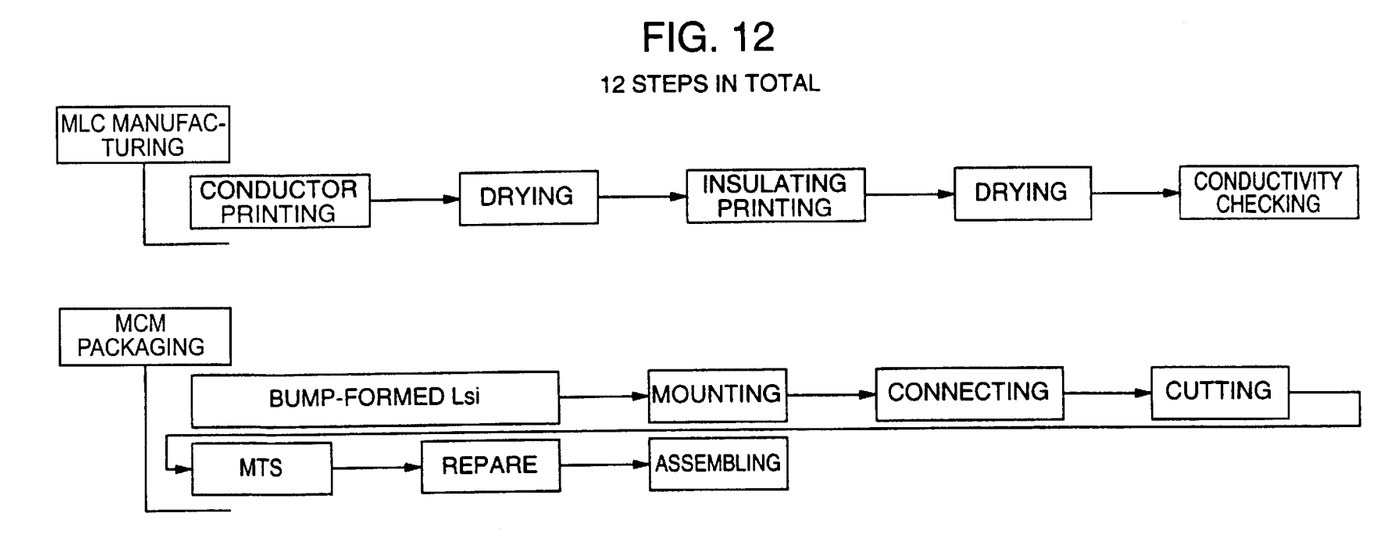
FIG. 12 illustratively indicates a board manufacturing method according to an embodiment of the present invention.
Figure 13A:
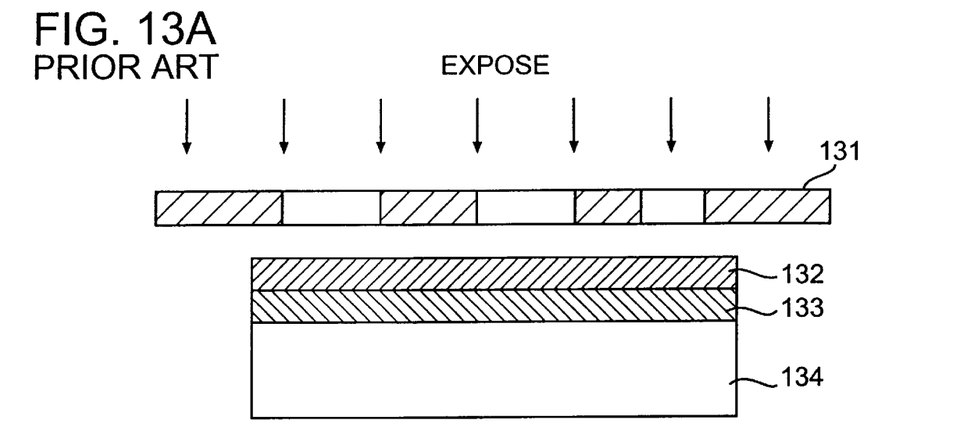
FIG. 13A to FIG. 13D illustrate the conventional conductive pattern printing method.
Figure 13B:
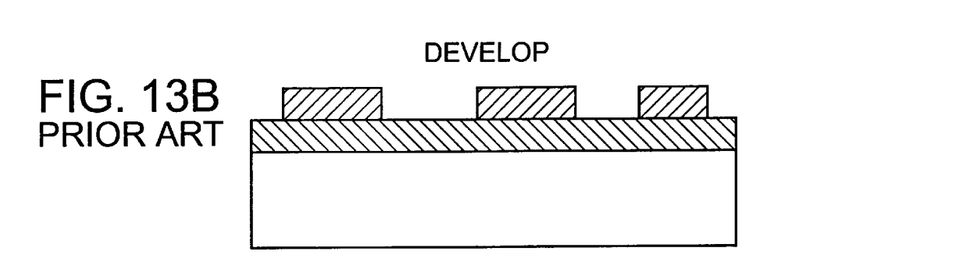
Figure 13C:
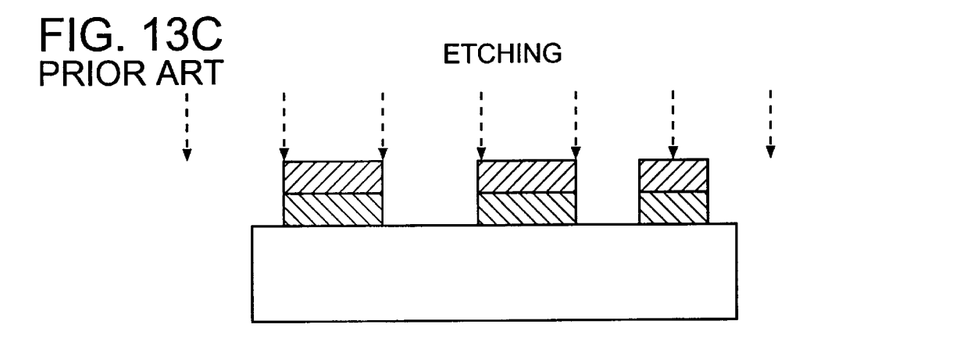
Figure 13D:
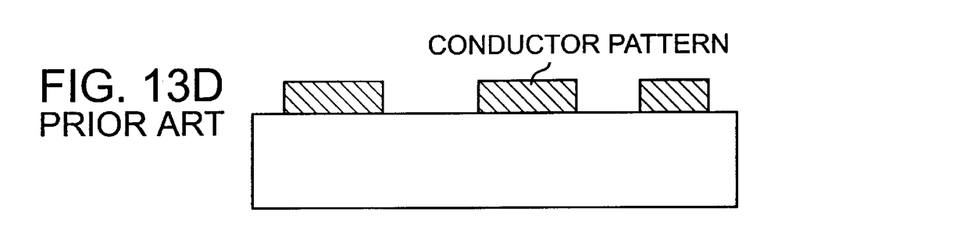

The total number of manufacturing steps for to the conventional board manufacturing method and the inventive board manufacturing method will now be compared with each other with reference to FIG. 11 and FIG. 12. FIG. 11 represents one example of the conventional board manufacturing steps, and FIG. 12 shows the board manufacturing steps according to the present invention. Although a detailed explanation about the respective manufacturing steps is omitted, 39 manufacturing steps are required in total in the conventional manufacturing method, whereas 12 manufacturing steps are required in total so as to manufacture the board, as shown in FIG. 12, in accordance with the manufacturing method of the present invention. Since the total number of manufacturing step of the present invention can be greatly reduced, both the time and the manufacturing cost can be reduced.

Also, in the conventional manufacturing method, manufacturing facilities are required for each of these manufacturing steps. To the contrary, in accordance with the present invention, if both the printing facility and the drying facility are provided, then the board can be manufactured. As a consequence, since the total manufacturing facilities can be reduced, the cost required for these manufacturing facilities can be reduced.

In accordance with this embodiment, the description has been made of the three conductor layers. Alternatively, it is possible to manufacture a printed circuit board having an arbitrary number of conductor layers by repeatedly performing both the above-explained conductor printing stages and the insulating material printing stages. In other words, the inventive board manufacturing method does not require the step for creating holes in insulating layer, the step for filling the paste into the holes, and the step for pressing the stacked layer, which have been explained in the prior art manufacturing method. Therefore, the stacked layer circuit board can be simply manufactured by merely repeating the printing steps of the conductors and the insulating materials in accordance with the present invention.

Also, when the manufacturing method of the present invention is used, a printed circuit board having higher cost performance can be easily manufactured at low cost, while the widely used printed board and ceramic board are employed as the base board, and the conductor layers and the insulating layers as indicated in FIG. 1 are stacked on this base board to form a stacked layer.

Figure 2:
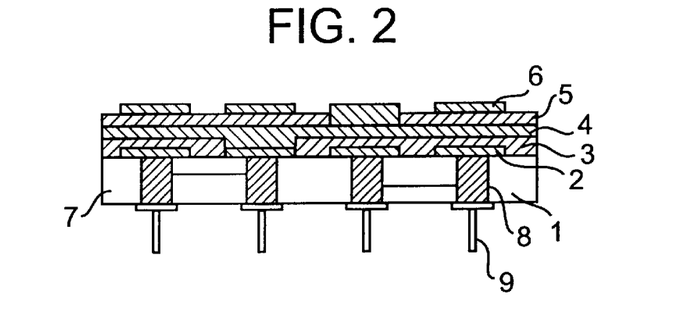
FIG. 2 is a sectional view for showing a printed circuit board manufactured according to another embodiment of the present invention.

Such a stacked layer embodiment is shown in FIG. 2. It should be noted that the same reference numerals shown in FIG. 1 will be employed as those for denoting the same or similar elements of FIG. 2.

In FIG. 2, a base board is constituted by employing a ceramic board which has been generally and widely used and manufactured by way of the above-described conventional method, and by a ceramic base 7, a conductor layer 8 formed in the ceramic base 7, and an external interface pin 9 mounted on the ceramic base 7.

A conductor material under paste condition is printed out on the conductor layer 8 of the base board to thereby form the first conductor layer 2, so that the electrical conductivity between this first conductor layer 2 and the conductor layer 8 of the base board can be secured. Thereafter, an insulating layer and a conductor layer are alternately formed by the manufacturing steps shown in FIG. 1 to be hardened. As a result, another conductor layer is further stacked on the normally used printed circuit board, so that a multi-layer board may be manufactured.

Alternatively, as the base board, a printed board using an organic material such as glass-epoxy resin may be applied.

It should also be noted that after an insulating material is first printed in the pattern form on the base board to be hardened, a printed circuit board may be manufactured in accordance with a similar method, if required.

Next, referring now to FIG. 3A and FIG. 3B, a description will be made of a packaging example such that an electronic component such as an LSI (large-scale integrated circuit) is packaged on the printed circuit board manufactured by the manufacturing method of the present invention.

Figure 3A:
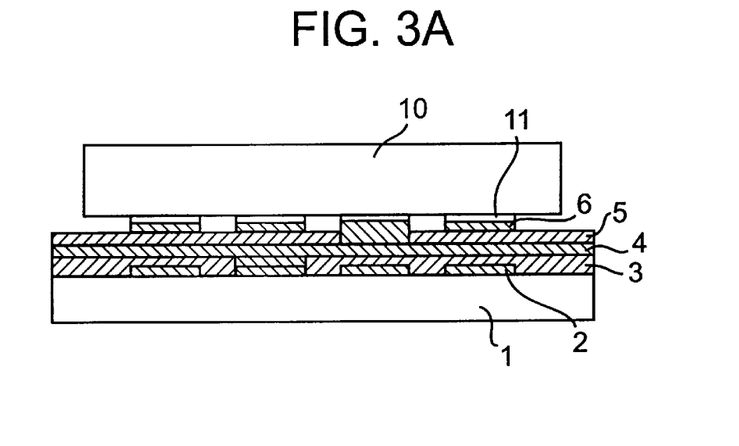
FIG. 3A and FIG. 3B represent an example of packaging electronic components on the printed circuit board manufactured by the present invention.
Figure 3B:
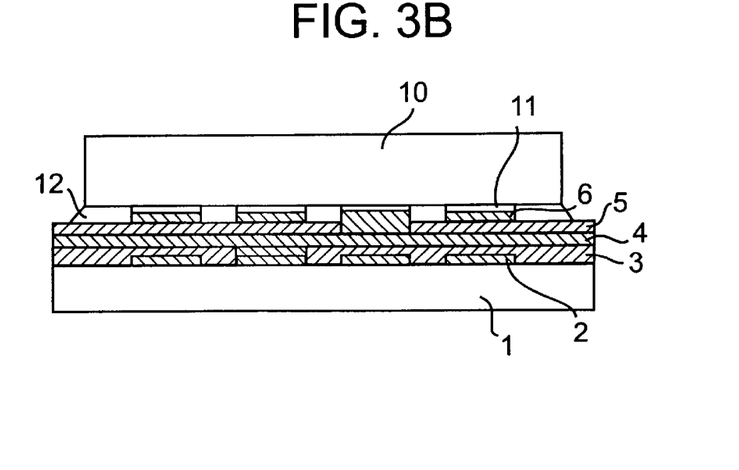

In FIG. 3A and FIG. 3B, reference numeral 10 shows an electronic component such as an LSI, reference numeral 11 indicates an electronic component electrode, and reference numeral 12 denotes an under filling adhesive agent.

As indicated in FIG. 3A, when the electronic component 10 is packaged on the printed circuit board, a printed circuit board is manufactured by way of the manufacturing step shown in FIG. 1, and the third conductor layer 6 is printed in a pattern form. Immediately after this pattern printing, the electronic component 10 is mounted at a mounting position on the third conductor layer 6 before this conductor material is hardened. At this time, the electronic component 10 is held on the third conductor layer 6 by the adhesive characteristic of the conductor layer before hardening. Then, the third conductor layer 6 is dried to be hardened under such a condition that the electrode 11 of the electronic component is made in contact with the connection portion of the third conductor layer 6.

While the electrical conductivity between the electronic component and the conductor layer is maintained by the fixing force of the conductor material when this third conductor layer 6 is hardened, the electronic component can be directly connected with the conductor layer by using the mechanical holding force under which the electronic component is not disconnected from the conductor layer even if this electronic component is drawn along the vertical direction by about 200 gf force, so that the electronic component 10 can be firmly packaged on the printed circuit board.

Since the electronic component is directly connected to the third conductor layer 6, the conventionally required manufacturing steps are no longer required, namely, the solder supplying step, the flux coating step, and the solder drying step are not needed, so that the total step number can be decreased and the time can be shortened.

Also, if required, as represented in FIG. 3B, the under filling adhesive agent 12 may be filled into the lower surface of the electronic component 10, so that the mechanical holding force established between the electronic component and the conductor layer may be reinforced.

Figure 4:
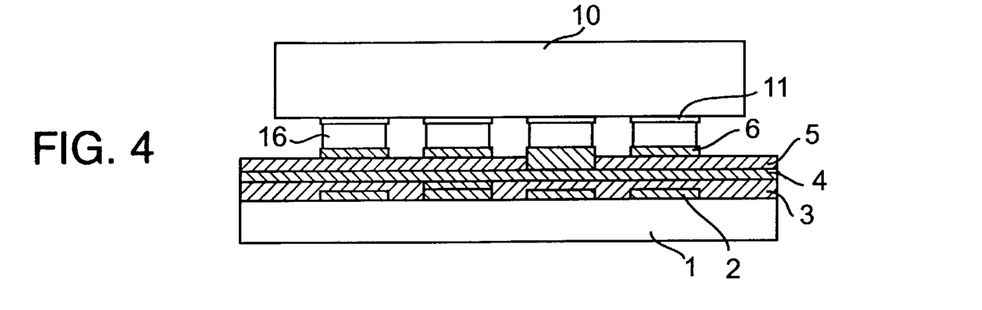
FIG. 4 shows another example of packaging electronic components on the printed circuit board manufactured by the present invention.

Referring now to FIG. 4, another embodiment of an electronic component will be described.

In this embodiment, either solder or a joint material 16 such as a conductive adhesive agent is supplied to a space between the electrode 11 of the electronic component and the third conductor layer 6 of the printed circuit board so as to connect the electronic component 10 with the third conductor layer 6. In other words, the layers up to the third conductor layer 6 are printed in the pattern form in accordance with the manufacturing steps indicated in FIG. 1, and then the patterns are dried and hardened to complete a printed circuit board. Thereafter, the joint material 16 such as solder is supplied by way of the printing manner to an electronic component mounting position on the third conductor layer 61. Then, the electronic component 10 is mounted via the supplied joint material 16 on the third conductor layer 6, under which condition the printed circuit board is heated so as to melt the joint material 16. At a result, the electronic component is connected to the printed circuit board.

It should also be noted that in order to secure the connecting reliability, the thermal expansion coefficient of the printed circuit board must be substantially coincident with that of the electronic component to be packaged on this printed circuit board. As previously described, in accordance with the method for manufacturing the printed circuit board, the thermal expansion coefficient of the printed circuit board may be substantially determined by the material of the base board, and moreover, a selection can be freely made of the material being employed as the base material of the base board. As a consequence, when an electronic component to be mounted is made of, for instance, ceramics, a ceramic board may be selected as the base board. Also, when a thermal expansion coefficient of an electronic component to be mounted is close to that of a metal, a metal plate may be selected as the base board. In this case, after the insulating paste is first printed out on the base board and then hardened, a printed circuit board is manufactured in the above-described manufacturing manner.

Also, an anisotropic conductive film may be employed as the joint material instead of the above-explained solder, so that the electronic component 10 may be connected to the third conductor layer 6. In this case, the anisotropic conductive film is supplied to the space between the electrode 11 of the electronic component and the third conductor layer 6, and is heated while both of the electrode 11 and the third conductor layer 6 are pressured so as to be connected with each other.

Next, a description will be made of a case in which the manufacturing method of the present invention is applied to a thin card for mounting thereon an electronic component, e.g., an IC card, with reference to FIG. 5A to FIG. 5F, FIG. 7, and FIG. 10.

First, the conventional thin card manufacturing method will be explained with reference to FIG. 10.

Figure 10:
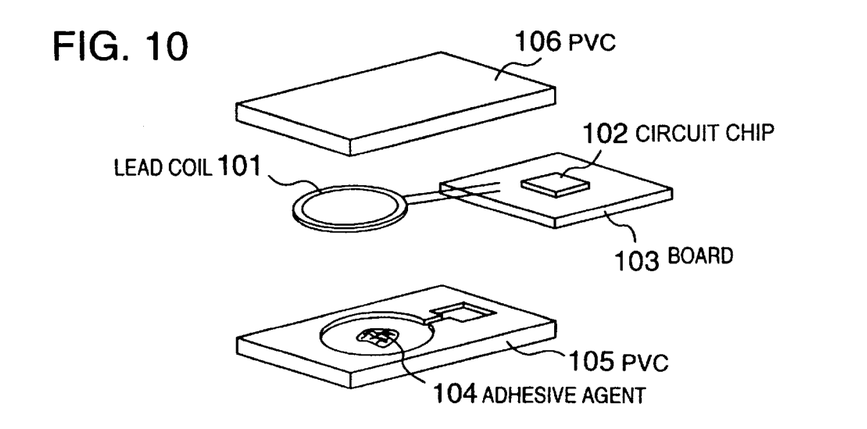
FIG. 10 is a schematic illustration for conceptually explaining the conventional method for manufacturing the thin card.

In FIG. 10, reference numeral 101 shows a lead coil, reference numeral 102 indicates a circuit chip, reference numeral 103 denotes a board, reference numeral 104 represents an adhesive agent, and reference numerals 105 and 106 show polyvinyl chloride (referred to as "PVC" hereinafter).

The lead coil 101 and the circuit chip 102 are soldered to the printed circuit board 103, or are jointed to the printed circuit board 103 by the thermal compression method. Subsequently, a desirable concave portion is formed in the PVC material 105, and the lead coil 101 and also the circuit chip 102 are fixed on the PVC 105 by using the adhesive agent 104 while maintaining the electric junction between the lead coil 101 and the circuit chip 102. Thereafter, the PVC 106 for the upper cover is melt-connected by using ultrasonic processing and other processing.

When the lead coil 101 is jointed and the circuit chip 102 is jointed, if tin/lead eutectic solder (melting point=183° C.) is used, a heating rod having a temperature higher than 180° C. must be utilized, because these elements should be heated at temperatures higher than or equal to this melting point. Also, in such a case that the anisotropic conductive film is employed to joint the circuit chip, it is required to employ a heater having a heating temperature higher than or equal to 180° C. as the heating compress-jointing heater.

Next, another description will be made of the method for manufacturing the thin card according to the present invention, with reference to FIG. 5 and FIG. 7.

In FIG. 5A to FIG. 5F, reference numeral 201 indicates a board which constitutes the above-described base, namely a flexible board, i.e., PET (polyethyleneterephthalate). Reference numeral 202 indicates a first conductor layer, reference numeral 203 shows an insulating layer, reference numeral 204 represents a second conductor layer, reference numeral 211 denotes a circuit chip terminal (electronic component electrode), reference numeral 210 shows a circuit chip (electronic component), reference numeral 217 represents an adhesive agent, and reference numeral 212 denotes sheet-shaped PET with a laminated surface.

Figure 7:
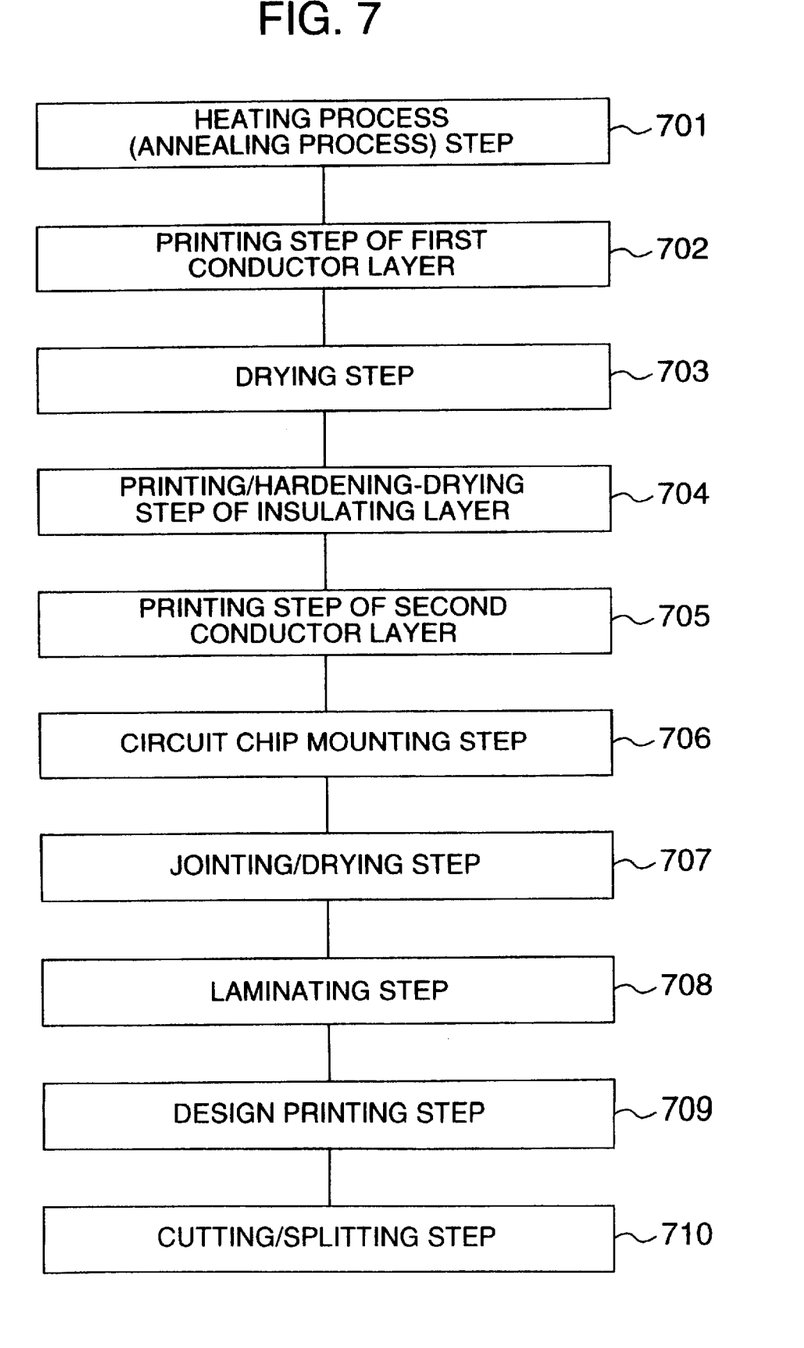
FIG. 7 shows a manufacturing step of a thin card manufactured according to an embodiment of the present invention.

FIG. 7 represents a flow chart for describing the above-explained manufacturing method of this embodiment. Reference numeral 701 shows a heating process (annealing process) step, reference numeral 702 indicates a printing step of the first conductor layer, reference numeral 703 represents a drying step, reference numeral 704 denotes a printing/harden-drying step of the insulating layer, and reference numeral 705 shows a printing step of the second conductor layer. Also, reference numeral 706 shows a circuit chip mounting step, reference numeral 707 shows a jointing/drying step, reference numeral 708 is a laminating step by using the PET 212 with the adhesive agent 217, reference numeral 709 shows a design printing step, and reference numeral 710 denotes a cutting/splitting step.

Figure 5A:
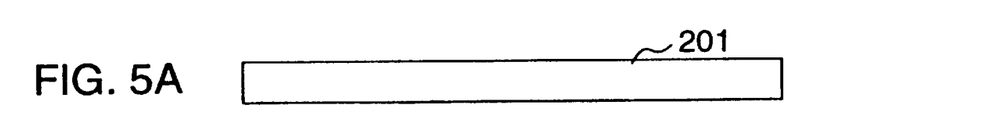
FIG. 5A to FIG. 5F illustrate a packaging example of a method for manufacturing a thin card according to the present invention.
Figure 5B:
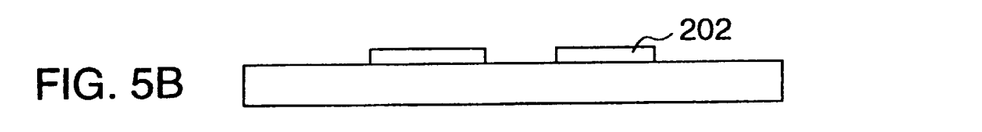

In the beginning, as shown in FIG. 5B, the first conductor layer 202 made of Ag is formed on the PET 201. The formation of the conductor layer is carried out by employing the normally used conductor pattern printing method. As the printing method, for instance, the following screen printing method is carried out by which a mask having an opening portion is covered on a desirable pattern form, over which conductive paste is supplied. Then, the conductive paste is extended by using a squeegee (printing step 702 of first conductor layer).

Next, the PET 201 having the formed first conductor layer 202 is set into a furnace, and then is heated at a temperature of 150° C. for approximately 5 minutes so as to be dried (drying step 703).

Figure 5C:
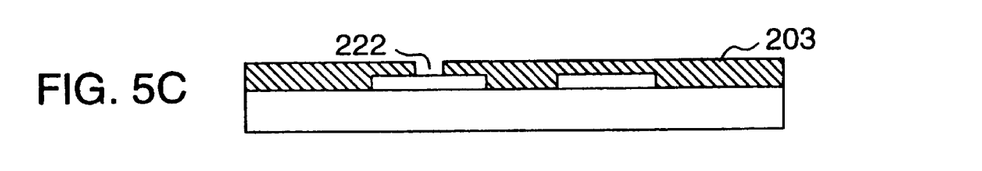

After the first conductor layer 202 has been dried, as indicated in FIG. 5C, an insulating material under paste condition is printed in a pattern form on the first conductor layer 202 and the PET 201 by using, for instance, the screen printing method similar to that for the conductor layer. At this time, in order that the second conductor layer 204 is electrically connected to the first conductor layer 202, which will be formed on the insulating layer 203, the insulating layer 203 is previously patterned in such a manner that a connection opening portion 222 is formed in this insulating layer 203.

Generally speaking, the printed insulating layer 203 is usually hardened by performing the drying process. In such a case that ultraviolet hardening type resin (resist) is used as the insulating material, this resin can be hardened within a short time by irradiating ultraviolet rays having wavelengths suitable for this insulating material (printing/harden-drying step 704).

Figure 5D:
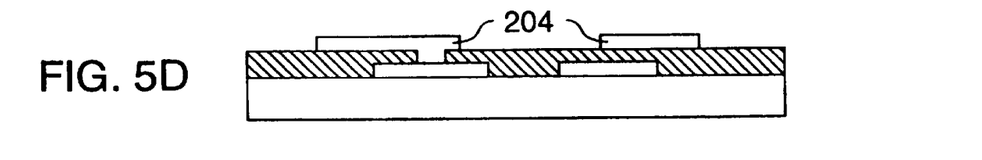

Next, as shown in FIG. 5D, the second conductor layer 204 is printed in a pattern form on the insulating layer 203 (printing step of second conductor layer 705). At this time, the conductor is printed on the connection opening portion 222 previously formed on the insulating layer 203, resulting in such a condition that the first conductor layer 202 is electrically connected with the second conductor layer 204.

Figure 5E:
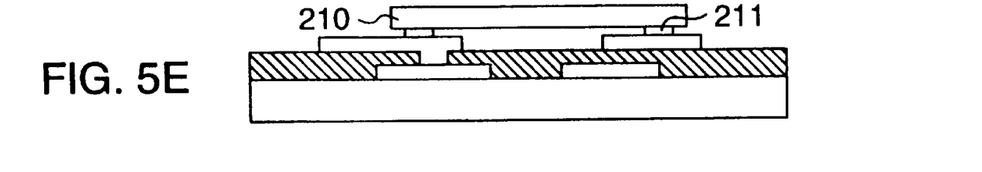

Before the second conductor layer 204 is hardened, as indicated in FIG. 5E, the electronic component 210 is mounted in fitting with the print pattern, and a circuit chip terminal 211 (for example, Au with a thickness of 15 μm) of the circuit chip 210 is connected to the second conductor layer 204 (circuit chip mounting step 706).

Figure 9A:
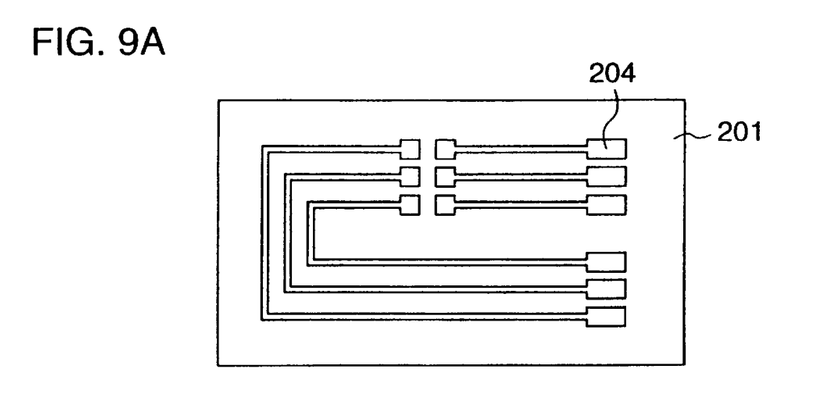
FIG. 9A and FIG. 9B are plan views for indicating electronic components packaged on a board.
Figure 9B:
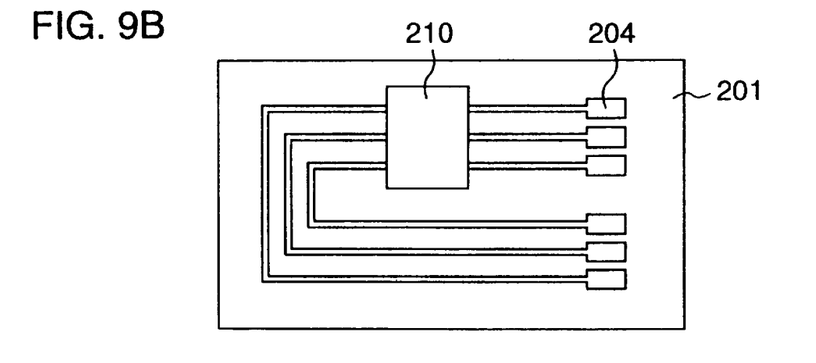

FIG. 9A and FIG. 9B indicate plan views for showing such a condition that the circuit chip 210 is mounted on the second conductor layer 204. That is, FIG. 9A represents a state before the circuit chip is mounted on the second conductor layer, and FIG. 9B shows a state after the circuit chip is mounted on the second conductor layer.

The positioning operation is carried out in such a manner that each of the plural terminals of the circuit chip is connected to a land used to connect the circuit chip, which is provided at the circuit chip mounting position of FIG. 9A, and the terminals are mounted on the second conductor layer 204. At this time, the circuit chip is held on the PET 201 by the adhesive force of the conductive paste which is not yet dried.

Thereafter, the board is conveyed to a drying path while suppressing the convey acceleration lower than or equal to 1 G of vibrations, and then is entered into the furnace so as to be heated for approximately 5 minutes, so that the terminals are adhered and at the same time, the conductor patterns are dried (jointing/drying step 707).

Figure 5F:
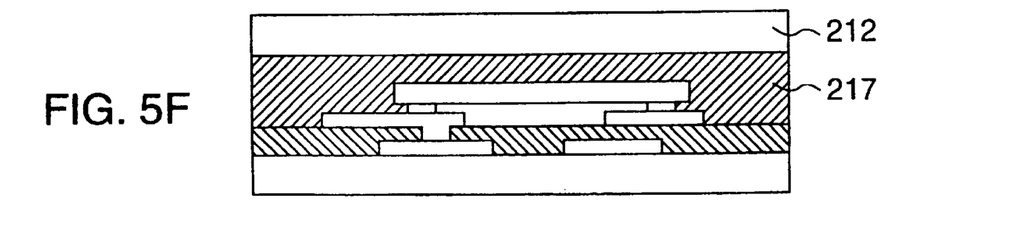

Subsequently, as indicated in FIG. 5F, an adhesive agent 217 is coated on a surface, and the uppermost surface is covered with the sheet-shaped PET 212, and then a heat roll is carried out at a temperature of approximately 120° C. and the heated board is laminated (laminating step 708).

Finally, a pictorial design is printed on the manufactured thin card by using the offset printing method and the screen printing method (design printing step 709).

Since the card manufactured by this manufacturing method is very thin and has large flexibility, even when the offset printing operation or the screen printing operation is carried out, there are neither cracks nor disconnections in the circuit chip 210. Thus, this card may be printed in a manner similar to that for paper. For example, the card may be set to an offset printing machine using oily ink to be printed out in a similar printing manner to paper. This oily ink is useable for plastic and the like. Then, the oily ink may be used to print out the set card via the screen functioning as the mask.

Alternatively, before a card is formed, a pictorial design may be printed out on a PET sheet which will constitute a base material of this card, or a PET sheet to be laminated. Since the conductor wiring patterns and the circuit chip have been mounted on the card when the formed card is printed out, in such a case that the circuit chip is thick, there are some possibilities that bending stress is applied to the circuit chip, and therefore cracks will occur. To this end, when such a component as a circuit chip which may be easily damaged by bending stress must be mounted, it is preferable to previously print out a pictorial design. Also, in case of a transparent PET sheet, a circuit packaging surface of the transparent PET sheet is previously printed. As a result, a transparent luster of the PET sheet remains, and neither a concavity nor a convexity appears, which could be produced when the surface of this PET card is printed out, and the printed pictorial design is not faded.

Alternatively, if the PET 201 functioning as the base shown in FIG. 5A is processed by the heating process (annealing process) 701 at a temperature higher than or equal to the highest temperature applied in all of the processing steps of FIG. 7 at the first stage of the processing steps of FIG. 7, then the thermal shrinkage rate by of the PET 201 may be considerably lowered.

For instance, the thermal shrinkage rate of the PET 201 is equal to 0.03% in the case that after this PET 201 has been previously annealed at 160° C. for 5 minutes, the annealed PET 201 is heated at 150° C. for 5 minutes. The thermal shrinkage rate of the PET 201 is equal to 0.5% in the case that no annealing process is carried out for this PET 201, and then this PET 201 is heated at 150° C. for 5 minutes. The first thermal shrinkage rate is different from the second thermal shrinkage rate more than one digit.

In other words, in such a case that the pattern printing operation is repeatedly carried out several times by previously performing the annealing process to the PET 201 so as to suppress thermal shrinkage, the mask positioning precision during the pattern printing operation can be improved, so that a high-grade card can be manufactured.

Referring now to FIG. 6, another method for manufacturing a thin card will be described.

Figure 6A:
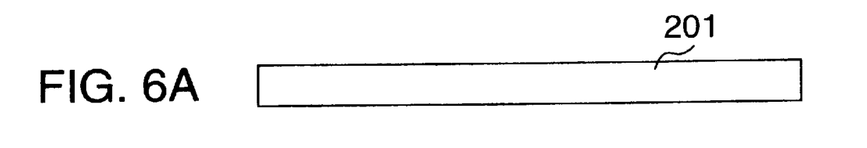
FIG. 6A to FIG. 6F represent another packaging example of a method for manufacturing a thin card according to the present invention.
Figure 6B:
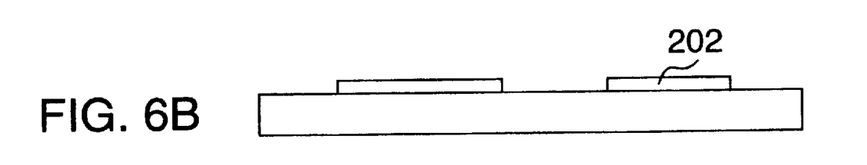
Figure 6C:
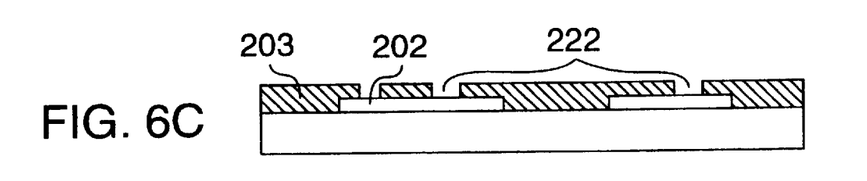
Figure 6D:
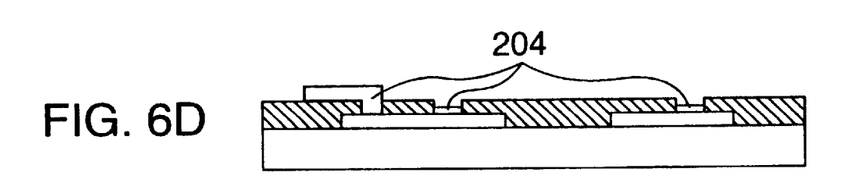
Figure 6E:
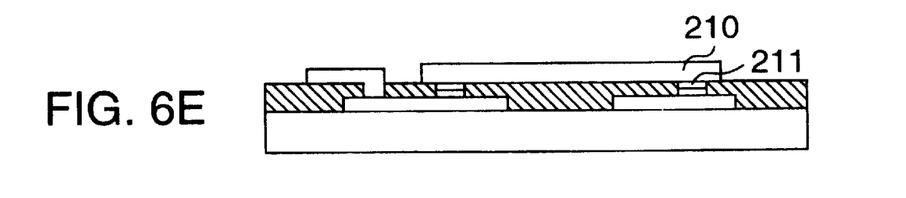
Figure 6F:
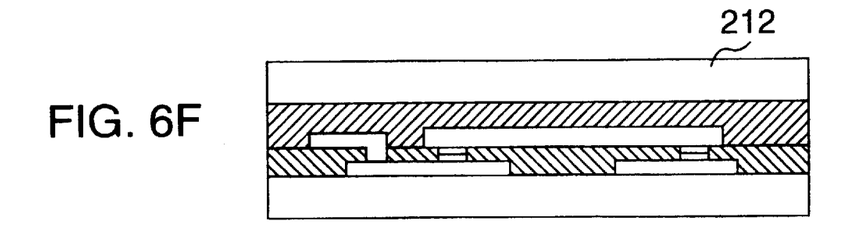

A manufacturing step of this manufacturing method is substantially equal to that as explained in FIG. 5A to FIG. 5F, and FIG. 7. As illustrated in FIG. 6D, when the second conductor layer 204 is formed, the connection opening portion 222 formed in the insulating layer is not completely filled with the conductor paste, but the second conductor layer 204 is formed in such a manner that an upper portion to which the conductor paste is not filled is left. Then, the circuit chip terminal 211 is inserted into such a portion of the opening portion 222 into which the conductor paste is not filled. As a consequence, the circuit chip terminal 211 is electrically connected to the second conductor layer 204 in the opening portion 222. Accordingly, as shown in FIG. 6F, there is no space between the insulating layer 203 and the circuit chip 210, so that the resultant card can be made thinner.

Also, the present invention may achieve another effect as to the conventional problem such that the conductor paste could not be sufficiently filled into the small diameter holes (in this case, opening portion 222 of insulating layer 203). That is, even if the conductor paste is not sufficiently filled into the opening portion 222, when the circuit chip terminal 211 is inserted into the opening portion 222, the soft conductor paste which is located inside the opening portion 222 and is not yet dried may fill the remaining space. As a consequence, a better connection condition can be established between the circuit chip terminal 211 and the conductor paste. Accordingly, it is possible to avoid the circuit disconnection problem previously caused by the conductor paste being insufficiently filled into the small diameter holes.

Figure 15:
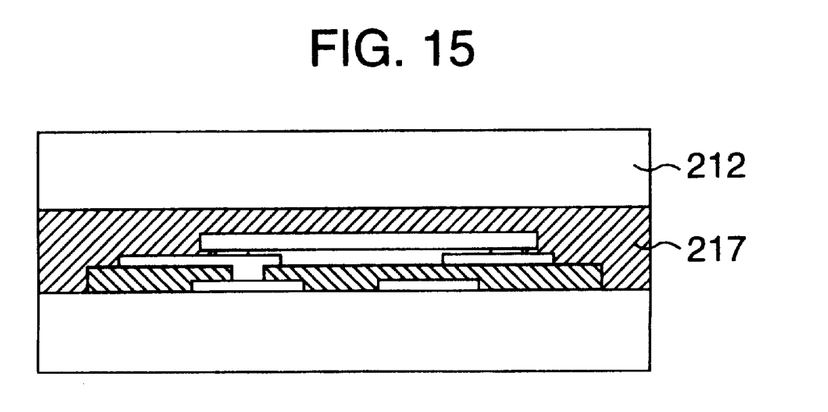
FIG. 15 a sectional view for representing the thin card manufactured in accordance with the present invention.

In this case, according to this embodiment, the thickness of the PET is 80 to 100 μm, the thickness of the Ag paste is 10 to 20 μm, the thickness of the insulating layer 3 is 20 to 40 μm, the thickness of the circuit chip 10 is 50 μm, and the thickness of the thickest portion of the adhesive agent layer is 50 to 140 μm. As a consequence, as shown in FIG. 15, the thickness of the manufactured card may be determined based on the thickness of the PET and the thickness of the thickest portion of the adhesive agent layer, and may be made smaller than or equal to 0.34 mm. For instance, if the thicknesses of the Ag paste and of the insulating layer are determined in such a condition that the thickness of the PET becomes 100 μm, the thickness of the circuit chip becomes 50 μm, and the thickest portion of the adhesive agent layer becomes 100 μm, then it is possible to manufacture a card having a thickness of 0.3 mm. Also, if the thicknesses of the Ag paste and of the insulating layer are determined (for example, Ag paste thickness is 10 μm, and insulating layer thickness is 20 μm) in such a manner that the thickness of the PET is 80 μm, and the thickness of the thickest portion of the adhesive agent layer is 90 μm, then it is possible to manufacture a card having a thickness of 0.25 mm. In order that the manufactured card owns flexibility with which this card can be printed by using the offset printing machine as the circuit chip to be used, it is desirable to employ a card having a thickness less than or equal to 100 μm.

Figure 14:
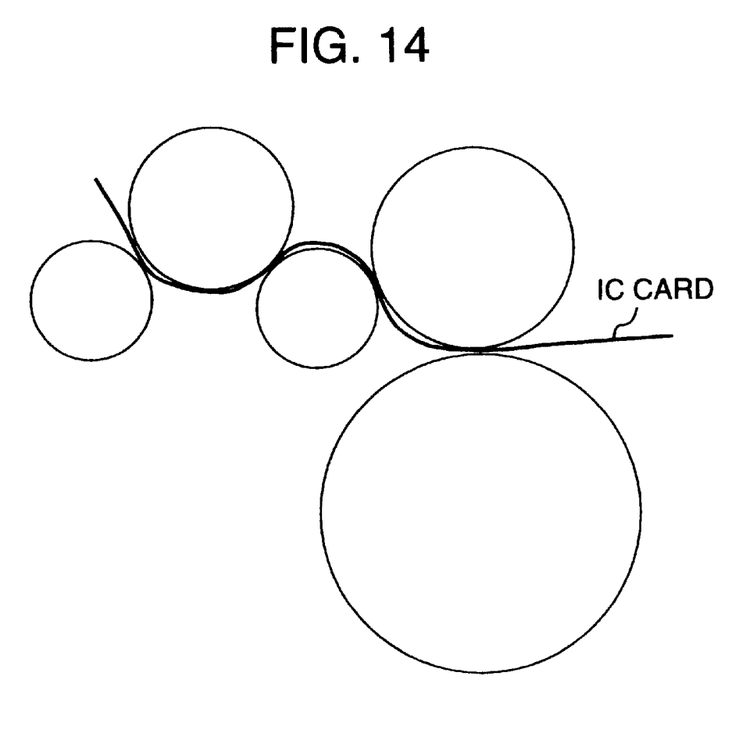
FIG. 14 is a conceptually idea illustration of offset printing.

An offset printing machine comprises three kinds of cylinders, namely a plate cylinder, a rubber blanket cylinder, and an impression cylinder. Damping water and ink are attached to a print plate wound around the plate cylinder, so that the ink is transferred to the rubber blanket cylinder. Next, a material passing through the rubber blanket cylinder and the impression cylinder is printed. As a result, in the printing operation by using the offset printing machine, as indicated in FIG. 14, since the card is transported in such a manner that this card is penetrated among a plurality of rollers, the following conditions are required. That is, the circuit chip is not broken in this printing step, and the card itself must have flexibility and such a thickness under which this card can be printed by the printing machine. The thickness of the card manufactured by this manufacturing method can be suppressed less than or equal to 0.3 mm. Since the card owns the flexibility under which this card can be printed, this card may be printed in a similar printing manner to that of paper.

Also, it is preferable to use such a material having better joint characteristics with respect to the conductor paste which constitutes the conductor layer as the insulating material paste.

In this embodiment, for instance, when cards having a size of a name card are manufactured in a mass production, a PET plate having a dimension of 1 m×1 m, which will constitute a base, is prepared. Then, a plurality of similar conductor patterns are printed over the entire surface of this PET plate in the pattern form. An insulating layer is printed on this pattern-printed PET plate, and further a conductor layer is printed thereon. A circuit chip is mounted on each of preselected positions of the upper conductor layer, and a PET sheet is laminated on this resultant plate. Thereafter, a design printing operation is carried out in a batch mode. Subsequently, the final PET plate is subdivided by the size of the name card (54 mm×85.6 mm), so that the cards can be manufactured in mass production in high efficiencies (cutting/splitting step 710 of FIG. 7).

Alternatively, the design printing step 709 may be omitted, or may be carried out after the cutting/splitting step 710. When a design printing operation is carried out for the card-shaped sheet, any of personal printing machines (for instance, printers connected to personal computers) may be used, so that desirable pictorial designs may be freely printed out.

Also, when a transparent PET sheet is used, connection portions can be checked while manufacturing a card. Furthermore, when an electronic component is mounted, a YAG laser is directly irradiated from the PET side which constitutes the base so as to melt a solder material used to connect the electronic component terminal with the conductor layer. Thus, the terminal may be connected to the conductor layer.

As explained above, the adhesive agent 217 has been used in this embodiment. This is because this adhesive agent can avoid such a problem that the normally used hardening type adhesive agent is completely hardened, and owns the elasticity after being laminated so as to protect the connection portion. If any other adhesive agents may own similar effects, then these adhesive agents may be used.

In accordance with this embodiment, the laminate step 708 represents such a laminating method that after the adhesive agent 217 has been coated on the surface of the board, the uppermost surface is covered with the PET 212 and the heating roll is performed.

Alternatively, another laminating method may be employed that the PET 212 on which the adhesive agent 17 has been previously coated is laminated by heat-rolling the surface of the board.

It should also be noted that although the Ag paste is employed as the conductive paste in this embodiment, any other materials having electric conductivity such as Cu may be utilized as this conductive paste.

Figure 8A:
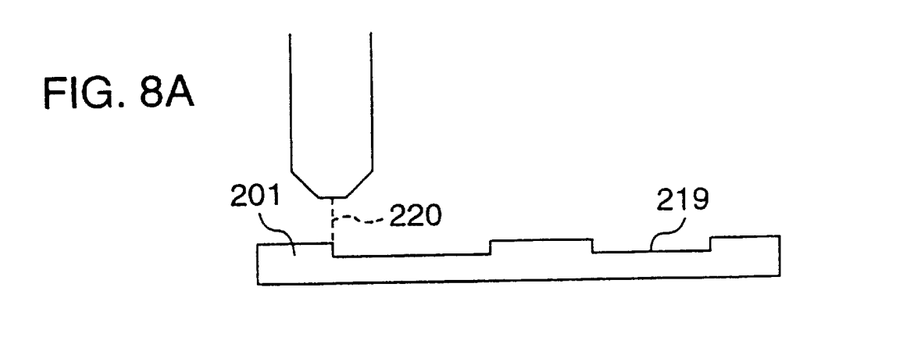
FIG. 8A to FIG. 8C indicate another packaging example of the method for manufacturing the thin card according to the present invention.
Figure 8B:
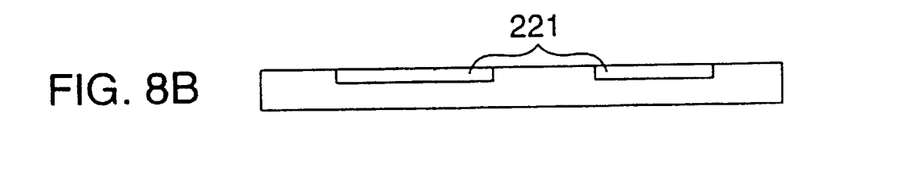
Figure 8C:
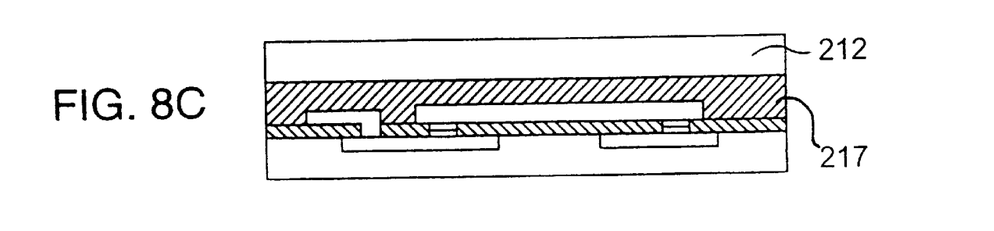

Referring now to FIG. 8A to FIG. 8C, a description will be made of an example of a method for manufacturing a conductor layer in order to form a thin card.

That is, laser 220 is irradiated onto the PET 201 functioning as the base board in such a manner that a wiring pattern shape 219 is drawn. A groove is formed in the wiring pattern shape in the PET 201 onto which the laser 220 is irradiated, and this portion is brought into an activated condition. Thereafter, the PET 201 is dipped into a plating fluid, so that a conductor layer 221 is deposited at the activated portion.

As shown in FIG. 8B, since the conductor layer 221 is formed at the portion activated of the PET 201 by the laser, the conductor layer 221 is not printed on the surface of the PET 201 under such a condition that this conductor layer 221 rises, but is printed at the same height as the surface of the PET 201. Thus, as the overall card, the total thickness thereof is made less than that of the embodiment shown in FIG. 5A to FIG. 5F by the thickness of the first conductor layer 2.

In accordance with the present invention, the printed circuit board with high density can be manufactured by pattern-printing the conductor materials and the insulating materials, and also repeating the hardening process operation. Therefore, neither the complex manufacturing steps, nor the large number of production facilities are required, which were required in the prior art. Thus, the printed circuit board can be manufactured at low manufacturing cost and within a short time.

In the case that the electronic component is packaged on the printed circuit board, the electronic component can be directly connected on the conductor layer by utilizing the adhesive characteristic of the pattern-printed conductor material before being hardened. As a consequence, the electronic component can be packaged on the printed circuit board with fewer manufacturing steps.

What is claimed is:

1. A flexible thin card comprising:

a first conductor layer pattern-printed on a desirable portion on a flexible base board;

a first insulating layer pattern-printed on a desirable portion on said first conductor layer;

a second conductor layer pattern-printed on desirable portions on said first conductor layer and said first insulating layer;

an IC chip mounted on a desirable portion on said second conductor layer;

and a sheet-shaped thin flexible substance laminate-processed via an adhesive agent on an uppermost surface of said base board;

wherein:

an electrode of said IC chip is connected to said second conductor layer without interposing any joint material between them.

2. A flexible thin card as claimed in claim 1 wherein:

a thickness of said first insulating layer is non-uniform.

3. A flexible thin card as claimed in claim 1 wherein:

said IC chip is mounted on said second conductor layer before said second conductor layer is hardened; and said second conductor layer is hardened under such a condition that the electrode of said IC chip is made in contact with said second conductor layer, whereby the electrode of said IC chip is connected to said second conductor layer.

4. A flexible thin card as claimed in claim 1 wherein:

thicknesses of said flexible base board and said flexible substance are 80 to 100 μm; thicknesses of said conductor layers are 10 to 20 μm; thicknesses of said insulating layers are 20 to 40 μm; a thickness of said IC chip is smaller than, or equal to 50 μm; the thickest portion of said adhesive agent after being laminate-processed is 50 to 140 μm; and a thickness of an overall card is smaller than, or equal to 340 μm.

5. A flexible thin card as claimed in claim 1 wherein:

said first insulating layer is an ultraviolet ray hardening type resin.

6. A flexible thin card as claimed in claim 1 wherein:

both said flexible base board and said flexible substance are made of PET (polyethyleneterephthalate).

7. A flexible thin card as claimed in claim 1 wherein:

both said flexible base board and said flexible substance are transparent PET (polyethyleneterephthalate) sheets; and an inside surface of each of the PET sheets is design-printed.

* * * * *